United States Patent [19]

Longini

[11] Patent Number: 5,517,106
[45] Date of Patent: * May 14, 1996

[54] METHOD AND APPARATUS FOR DIGITALLY MEASURING ELECTRICAL POWER

[75] Inventor: Richard L. Longini, Mars, Pa.

[73] Assignee: Digital KWH, Inc., Pittsburgh, Pa.

[*] Notice: The portion of the term of this patent subsequent to Oct. 29, 2008, has been disclaimed.

[21] Appl. No.: 157,924

[22] Filed: Nov. 24, 1993

Related U.S. Application Data

[63] Continuation-in-part of Ser. No. 766,136, Sep. 27, 1991, abandoned, which is a continuation-in-part of Ser. No. 514,255, Apr. 25, 1990, Pat. No. 5,061,890, which is a continuation-in-part of Ser. No. 390,234, Aug. 7, 1989, abandoned.

[51] Int. Cl.$^6$ .................................................. G01R 19/00
[52] U.S. Cl. ...................... 324/142; 324/103 R; 324/107
[58] Field of Search ................................. 324/117 R, 127, 324/142, 107, 103 R; 364/483, 492, 569, 577, 481; 340/538, 539, 657

[56] References Cited

U.S. PATENT DOCUMENTS

| | | | |
|---|---|---|---|
| 3,727,132 | 4/1973 | Antoniu et al. | 324/142 |
| 4,672,555 | 6/1987 | Hart et al. | 324/142 |
| 4,709,339 | 11/1987 | Fernandes | 324/127 |
| 4,931,725 | 6/1990 | Hutt et al. | 324/142 |
| 5,061,890 | 10/1991 | Longini | 324/107 |
| 5,300,924 | 4/1994 | McEachern et al. | 324/107 |

*Primary Examiner*—Vinh P. Nguyen
*Attorney, Agent, or Firm*—Carothers & Carothers

[57] ABSTRACT

A method and apparatus for digitally measuring electrical energy consumption parameters from a transmission line carrying alternating current. Current flowing in the conductor is sampled at multiple times which are independent of the current phase. Using an appropriate microcomputer, this sampled current is analytically filtered by expressing the current with Fourier Series using only selected harmonics thus eliminating those harmonics which define noise. An approximation of the power and power consumption is then computed by multiplying the current as expressed in Fourier Series and a voltage measurement from the conductor to obtain a power reading, and the power reading is summed to obtain a number value proportional to the energy consumption. Even harmonics and high frequency harmonics may be eliminated in the Fourier expression of the current derivative to further simplify computer computations and required hardware, and the magnetic rate of change pickup and the voltage pickup are preferably filtered to remove unwanted noise.

26 Claims, 2 Drawing Sheets

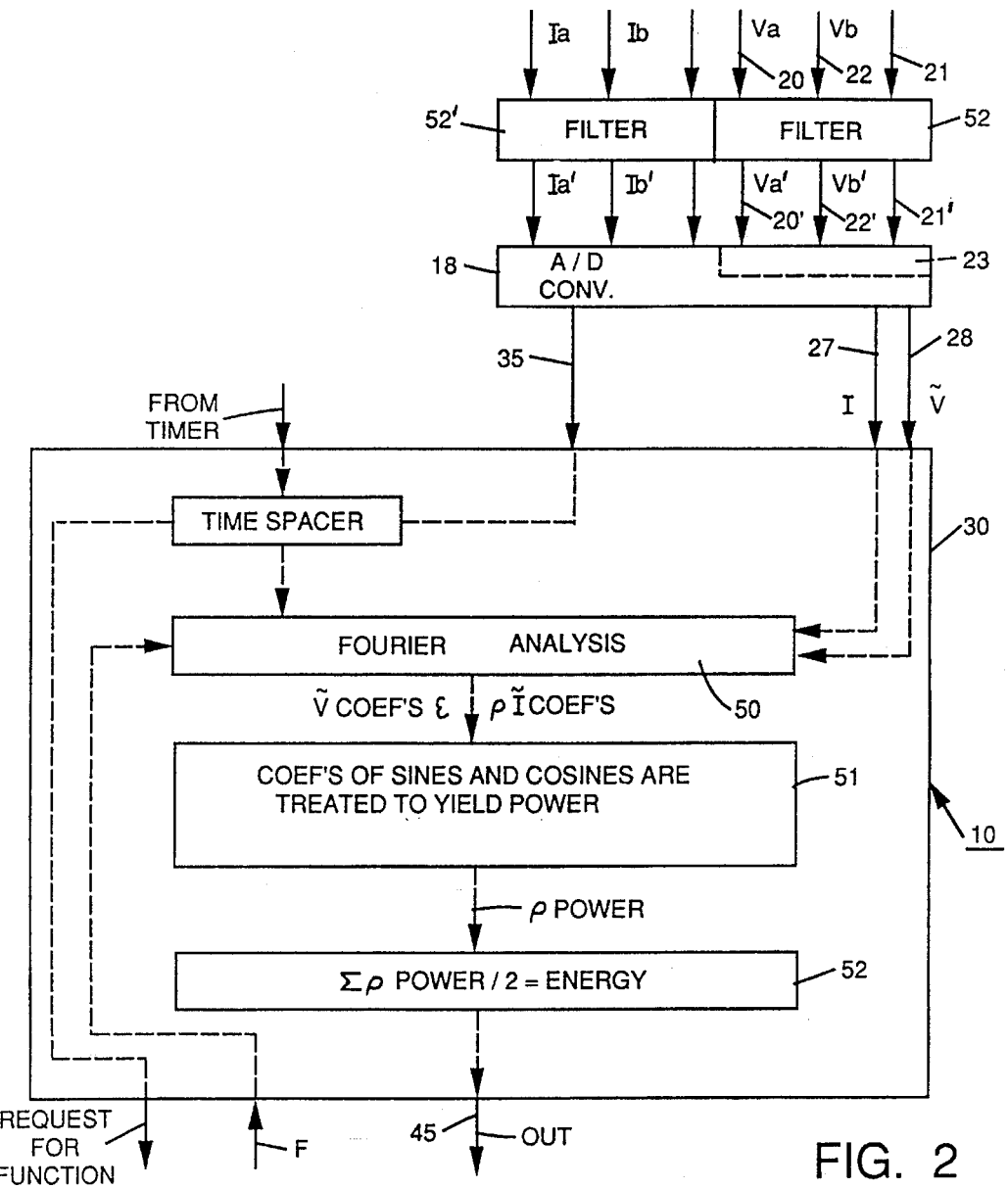
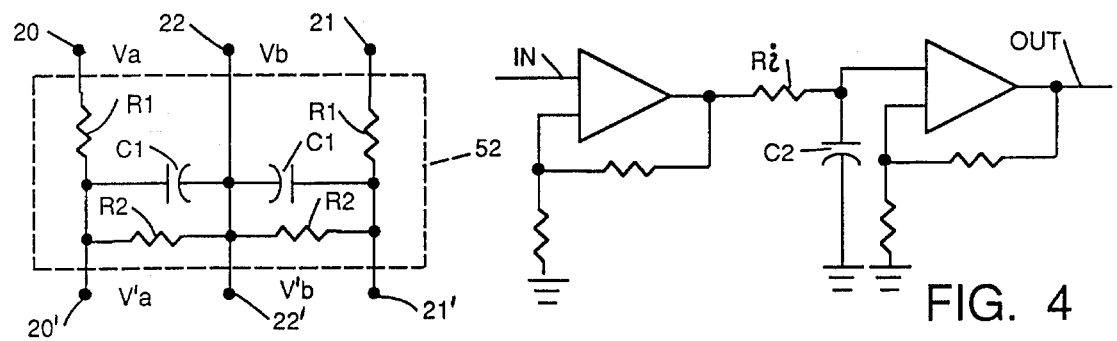
FIG. 2
FIG. 3
FIG. 4

METHOD AND APPARATUS FOR DIGITALLY MEASURING ELECTRICAL POWER

CROSS REFERENCES

The present application is a continuation-in-part of application Ser. No. 07/766,136, filed on Sep. 27, 1991, (now abandoned), which in turn is a continuation-in-part of application Ser. No. 514,255, filed on Apr. 25, 1990, now U.S. Pat. No. 5,061,890 issued Oct. 29, 1991, which in turn is a continuation-in-part of application Ser. No. 390,234, filed on Aug. 7, 1989 and now abandoned.

BACKGROUND OF THE INVENTION

The invention relates generally to a digital energy meter and, more particularly, to an improved digital electrical energy consumption meter which does not require the simultaneous measurement of current and voltage in order to obtain power consumption measurements of more than adequate accuracy.

The present invention pertains to the measurement of energy consumed by a load connected to an electrical transmission line that in turn is connected to an alternating current source or supply. Typical examples might be the supply of alternating current to a home or resident in the form of single phase alternating current, or to a commercial or industrial user in the form of a three phase alternating current supply.

The present invention further relates to the art of digital electrical energy consumption meters which are desirable in general because an effective digital meter should normally provide adequate accuracy with less expensive manufacturing and the capability of easy remote reading of power delivered via radio waves or telephone lines or the like.

The voltage supply varies sinusoidally, approximately, with time. However, the delivered current varies in time depending upon the nature of the load and the controls which regulate the load. For example, the current may be sinusoidal if the load consists of a heating element with some inductive characteristics. The current wave form will usually not match the voltage wave form instant by instant, but will probably be delayed slightly giving rise to a phase shift of current with respect to voltage. In addition, nonsinusoidal current wave forms will result from certain load controls such as semiconductor controls or semiconductor light dimmers, for example.

Instantaneous power is the current multiplied by the voltage at any instant. The effective power is the integral of the instantaneous power over time, divided by the time over which the integration takes place. Digital type meters presently known deduce this form instantaneous power measurements. Energy consumption meters (watt hour meters) yield the integral of instantaneous power over time, without the division mentioned above.

In power measurement procedures, prior art digital meters measure current and voltage separately, yet simultaneously, and multiply the current and voltage values to provide instantaneous power and then sum the results to give watthours. The values of voltage and current must each be digitized for this function. To achieve simultaneity the simple solution uses two digital to analog converters to make these two measurements of voltage and current thereby increasing the expense of manufacture.

Two difficulties of basic importance arise in implementation of known types of digital watt-hour meters. First, simultaneous readings of voltage and current are more costly than separately taken readings and it is obvious that cost must be kept to an absolute minimum when pertaining to meters that are going to be used in massive quantities. Second, the measurement of voltage is simple and very inexpensive, involving a simple resistor bridge or an equivalent, but current is measured on a line or conductor separated from a ground return line by a high voltage. Direct readings of current may be made using current transformers or Hall effect devices, for example. These give readings proportional to current and insulate the output from the input as far as the voltage is concerned. The direct readings of voltage and current must then be converted to power and energy.

The method and apparatus of the present invention eliminate the difficulty among other things, of taking simultaneous readings, and provide a digital watt-hour meter of more than adequate accuracy with analytical filtering.

SUMMARY OF THE INVENTION

The digital watt-hour meter of the present invention is all digital. Analog voltage and analog current or current derivative measurements are converted to digital readings, each by sampling, and made to yield direct kilowatt-hour or other desired energy consumption or current readings. Unlike existing digital meters and nondigital meters, the current used or measured in the calculations for the meter of the present invention is not the true current, but in fact is a mathematical approximation or pseudo current which is an approximation to the true current and is obtained by using an algorithmic series, such as the Fourier Series, which has the capabilities of expressing cyclic phenomena and utilizes a series of functions that are probably orthogonal. While the Fourier Series is presently known as the best way to represent this expression, it must be kept in mind that other cyclic and orthogonal expressions have been published and still others may be constructed by competent mathematicians and therefore the present invention should not be limited to the Fourier Series as it may well be that other algorithmic series will be similarly acceptable as an obvious equivalent or substitution.

The ideas and techniques discussed here are derivative of the Longini patent application Ser. No. 07/514,255, filed on Apr. 25, 1990 which issued into U.S. Pat. No. 5,061,890. Energy consumption measurements are theoretically obtained by simultaneous measurement of voltage and current, multiplying them together, and summing the results. The readings must be taken very close together in time, that is, very many times per cycle. In this disclosure, as with the above-mentioned disclosure, we may make very few readings per cycle and we do not make simultaneous measurements of voltage and current. Infrequent current measurements and/or voltage measurements are converted to Fourier Series representations and the coefficients of the Fourier components are used in the determination of energy consumption. Current and power readings in any harmonic can be a by-product of this process. Any harmonic not of interest may be excluded from the computations, thus easing the computation burden.

In fact, the current measurement is analytically filtered by expressing the current with Fourier Series using only selected harmonics thus eliminating those harmonics, especially higher harmonics, which herein defined noise. The electrical current in each line is measured at multiple times which may be independent of the current phase. Similarly the voltages between conductors of the transmission line and ground are measured at multiple times which may be independent of the voltage phase. A measurement of filtered power being of power being delivered through the transmission lines is computed by converting the filtered current or currents as expressed in Fourier Series and the voltage measurement mathematically to one or more power readings.

An analytical filtering of the voltage measurement can also be accomplished with the meter of the present invention by also expressing the voltage with Fourier Series using only selective harmonics thereof for thereby eliminating those harmonics which define noise. Power may then be computed by converting the filtered current as expressed in Fourier Series and the filtered voltage as expressed in Fourier Series to a filtered power measurement.

By expanding the current Fourier Series in a very short time (much less than a cycle), the meter of the present invention can still obtain the full series without analyzing the entire cycle. The meter is therefore capable of capturing surges and the like in addition to capturing an average current reading.

In other words, it can be desirable to take all the readings of a Fourier expansion group in a very short time, for example, a fraction of a cycle. This would result in a somewhat larger demand on the computer and digitizer portions of the meter, but would be far more stable if the line frequency itself were unstable.

The meter of the present invention is also capable of measuring the upward zero crossings of the voltage and adjusting the expression of the current and current harmonics relative to this zero crossing. This zero crossing can best be determined by first determining the Fourier coefficients of the fundamental for the voltage. The arctangent, in suitable units, of the fraction cosine coefficient divided by the sine coefficient is the time displacement needed in the current expansion to give proper current phase references relative to the voltage upward zero crossings. Since this is done in a noise free environment, the readings are more meaningful as they are more stable.

Additionally, the Fourier Series components of the current may be corrected to compensate for the known frequency attenuation and phase shift characteristics of the current transformer, when a current transformer is used in lieu of a derivative pickup.

The characteristics of the digital meter of the present invention are such that the meter can be inexpensively and effectively utilized to also measure the phase difference between the fundamental and selected harmonics of the filtered current and those of the voltage. The meter is thus easily capable of displaying all the parameters that are functions of the phase difference between voltage and current relationships, such as power factor and reactive power. The characteristics of the meter of the present invention are such that it can determine how much the current lags or leads the voltage fundamental and each harmonic.

In this invention a calculated or pseudo current and not the true instantaneous current is used. When each of these pseudo current and voltage readings are expressed as algorithmic or Fourier Series, it will be readily seen that all cross terms (between frequencies and between sines and cosines of one frequency) in the current voltage product drop out, that is, averaged to zero. Furthermore, the voltage wave form, as delivered by the power company transformer remains nearly sinusoidal, not normally being grossly distorted by the various loads on the system. The distortion is normally far less than that of the current wave form. The voltage wave form may or may not be expressed in an algorithmic or Fourier Series for calculation purposes.

The voltage wave form usually contains only a small harmonic content and no direct current component. The even harmonics of power are usually considered to be low as they are the result of imbalance between the two halves of both the voltage and current wave forms. For the usual precision, inclusion of even harmonics in the calculation of the current wave form is probably unnecessary. The required precision of the resultant meter does not therefore necessarily require inclusion of even harmonics in calculation of the current or voltage wave forms. The computations are clearly simplified if they are left out. A further benefit of excluding harmonics is that, at the least, the higher harmonics represent noise rather than currents or voltages generated by the utility.

Also, because of the following consideration, no attempt need be made to duplicate the high frequency found in the current in many applications. One result of harmonic analysis is the understanding that cross terms in frequency between voltage and current do not result in power. Thus, because the high frequency components of voltages delivered by the utility are very much smaller, no high frequency components need be computed for the current wave form for energy consumption determination. That is, the algorithmic or Fourier Series describing the current reading need have no high harmonic content in spite of the high harmonic content frequently actually found in the current.

The algorithmic or Fourier Series, utilized as the basis for the present disclosure, is applicable to all cyclic phenomena for the purpose of expressing the same. In theory it is strictly correct only if the cyclic phenomena is infinitely long or cyclic over prescribed finite limits. With regard to the method and apparatus of the present invention, it is used in a manner with reference to prescribed finite limits, but not strictly. For example, a thirty-two or sixty-four reading cycle may be utilized and be considered a prescribed range. This may be used in a feedback technique to modify a previously determined series. At the start, of course, there exists no previous series. In that case it may be utilized directly to obtain coefficients of the algorithmic series representation as though a "previously determined series" had been zero. Instead of using an adjustment means for a previously determined series, new coefficients are determined after every 32 or 64 reading cycle. This "noncomparison" embodiment, while not being required, is unique and saves a considerable amount of computations and is therefore desirable.

The voltage readings in this one example embodiment are not expressed in a series or algorithmic series, but can be thought of as a series with all components accurately determined. The product of current and voltage, therefore, can be thought of as that of two series though one of the factors was never expressed as a series.

In the above paragraphs we discussed converting the current readings to Fourier Series representation. The voltage readings were not represented by Fourier Series. An interchange can be made: where ever we have mentioned "current" or "voltage" we could interchange them. Thus we could represent voltage and not current by a Fourier Series, but if we do, we will not, of course, have any knowledge of current harmonic content. In all that follows, the two can be interchanged.

When the analytic expression for current is obtained, the current can be estimated for the time (either future or past)

of an actual voltage measurement. A reading of the two simultaneously could be critically more expensive, particularly when costs must be kept to an absolute minimum. Thus the pseudo current and voltage can be measured quite independently and still yield results as though simultaneous readings had been taken. In this arrangement, the current is computed for a few milliseconds ahead or recently behind, at a time when a voltage reading is to be or was taken. When the voltage reading or readings actually take place, it and the pseudo or calculated future or past current or currents are treated as simultaneous readings in the power calculation. If the voltage readings are taken first, they are stored, along with the appropriate time. When the currents have been computed for the corresponding voltage times the voltage readings are taken from storage, and, treating the voltage and current as simultaneous readings, the average cyclic power is calculated.

There is more than one way to compute the energy consumed with the digital meter of the present invention while still following the teachings thereof. For example, unlike the calculation method set forth hereinbefore, not only does the current and voltage not have to be measured simultaneously but, in addition, it is not required in an alternative embodiment that one be computed for the time of occurrence of the measurement of the other. In other words, it is not even always necessary in an alternative embodiments to, for example, compute an estimated future or recent past value or values of the approximated current, as expressed in an algorithmic series, for a selected future or recent past voltage reading time or times.

As an alternative, the energy consumption may also be obtained by expressing or also representing the voltage pickup measurement in an algorithmic series for expressing cyclic phenomena (as is described above for the current flow), and then the micro computer or micro processor (computer means) is further programmed to separately multiply the coefficients of sines and the coefficients of cosines for each harmonic in the current derivative and voltage algorithmic series expressions. For each harmonic and for the fundamental the coefficients of the sine series representing voltage are multiplied by the coefficients of the sine series representing current and the coefficients of the cosine series representing voltage are multiplied by the coefficients of the cosine series representing current. These are summed harmonic by harmonic. Thereafter a step of dividing the sum in half is carried out, to give a number value proportional to the energy consumed through the conductors.

The algorithmic or Fourier coefficients may be obtained in real time by a series of adjustments using the new feedback technique previously discussed. The readings of current, when taken, are compared to those computed from the algorithmic or Fourier Series. The deviation of the computed results from the actual current readings are noted. These deviations are the basis of the adjustments which are made to reduce them. As a result of not including higher harmonics, the calculated value may be in substantial error. This error will show up as noise. It will cause a fluctuation of Fourier component magnitude, but will not result in an accumulated error in the summations. The error wanders plus and minus and accordingly tends to cancel itself. In other words, the error is in both directions and in the end result cancels itself all practical purposes.

As previously noted, group readings may be made as opposed to single readings. When adjustments are made for a group of readings rather than just one, and if the number of readings in a group is not very large, the adjustment system will not converge to stable values even if the situation is stable and free of noise. Instead, the values computed for current will hunt around the correct value. The integral of power over time will not be substantially influenced by these "wandering" errors.

Also, as an alternative to simplify calculations, the values of the current already computed can, for this comparison process, be assumed to be zero such that this new group of readings is used directly to obtain new coefficients of the algorithmic series, as would be the case in start-up.

The measurements of current are taken at frequent, though not necessarily at equal intervals. After each reading, or group of readings, adjustments may be made to each of several coefficients of the algorithmic or Fourier Series. Thus the algorithm must determine how much of each correction is to be attributed to each coefficient.

It is also desirable to filter out unwanted noise from the current and voltage readings in order to remove noise that could otherwise interfere with proper metering functions. To accomplish this, these two pickup signals may be filtered either with passive or active filters. Examples of passive filters which might be used would be simple RC circuits or diode clippers. Obviously a combination of such elements may also be employed.

When filtering the voltage and current pickups, they are filtered to give identical phase shifts. Thereafter, the aforedescribed computations are carried out wherein algorithmic or Fourier expansion is carried out on the current pickup, or on both the current pickup and the voltage pickup output. Alternatively filtering may be done entirely analytically. Noise would be defined as only having frequency components which can be expressed by harmonics not selected for expansion.

If the algorithmic or Fourier expansion is performed only on the current pickup, thereafter each current harmonic coefficient is multiplied by the appropriate factor to correct for both current pickup attenuation and that of the corresponding voltage pickup attenuation, and then the process is continued as previously explained.

When the voltage pickup and the current pickup are filtered with identical phase shifts and attenuation filters, hereinafter called identical filters, the algorithmic or Fourier expansion may then be preformed on this output, and thereafter the voltage and current output harmonics are each multiplied by the factors to compensate for the known attenuation to which each has been subject, and then the process continues as previously explained.

As a further alternative, after the meter inputs are filtered with identical filters, the outputs for each harmonic involved may be divided by the attenuation factor for that harmonic, after which the process continues as previously explained.

As a further example of filtering, the voltage pickup and current pickup may be filtered to give identical phase shifts and then the algorithmic or Fourier expansion is performed on the current pickup output only. Thereafter each current pickup harmonic coefficient is divided by the square of its attenuation to correct for both it and the corresponding voltage pickup which has been put or placed in harmonic algorithmic form. Thereafter the computing process is continued as previously explained in order to obtain the energy consumption reading.

It is desirable that the timing of pseudo current and voltage measurements be independent of phase or of the zero crossings (of voltage or current) of the actual power system. If the timing is generated electronically, the cycle lengths of the fundamental and all harmonics will not coincide with the actual lengths in the power system. This will cause some slight, but more or less continuous phase shift as time goes on. With the adjustment processes proposed, this is no problem, but high harmonics, which possibly adjust the slowest, will also shift phase the fastest. Though precision is desirable, a timing accuracy of 1/20000 would probably be adequate for metering purposes. In those cases where time of day information is important, the micro computer can be reset once a month or so, automatically, when the meters are electronically read for billing purposes. The 1/20000 would then produce an error in start and stop of load time of about two minutes maximum. Greater accuracy, however, is very inexpensive.

In order to avoid loss of response to low current loads and to permit the use of an eight bit A/D converter (ten bit accuracy is probably needed, but eight bit A/D converters can be used in ways to obtain this accuracy), a signal will be added to the pickup. An added oscillator operating at about 2000 Hz (not a harmonic of 60 Hz) produces, for example, a saw toothed wave which is added to the voltage and current or current derivative signals.

This added voltage in the pickup should preferably be of magnitude of about 1/32 of the voltage pickup for the full scale reading (in a power system this would be about 2.82 times the nominal full scale reading).

If it is supposed the true signal going into a 0–5 volt A/D converter is only 0.01 V, it would read zero at all times whereas with the added signal discussed above each digitized value will be nearly that appropriate to the small added signal wave. The voltage will be modulated by the actual signal so that though the average readings over a small time span (on a 60 Hz basis) for the added signal alone would be about zero, it will now be about the true value of the signal. Thus, statistically we will now read a meaningful value for the true signal.

BRIEF DESCRIPTION OF THE DRAWINGS

Other objects and advantages appear in the following description and claims.

The accompanying drawings show, for the purpose of exemplification, without limiting the invention or the claims thereto, certain practical embodiments illustrating the principals of this invention, wherein:

FIG. 2 is a combination schematic block diagram and flow diagram showing a variation in the programmed microprocessor of FIG. 1 illustrating another embodiment of the teachings of the present invention.

FIG. 3 is a schematic diagram illustrating one embodiment of the filter portion of the apparatus shown in FIG. 2.

FIG. 4 is a schematic diagram illustrating another embodiment of the filter portion of the apparatus shown in FIG. 2.

DESCRIPTION OF THE PREFERRED EMBODIMENTS

Figure 1:
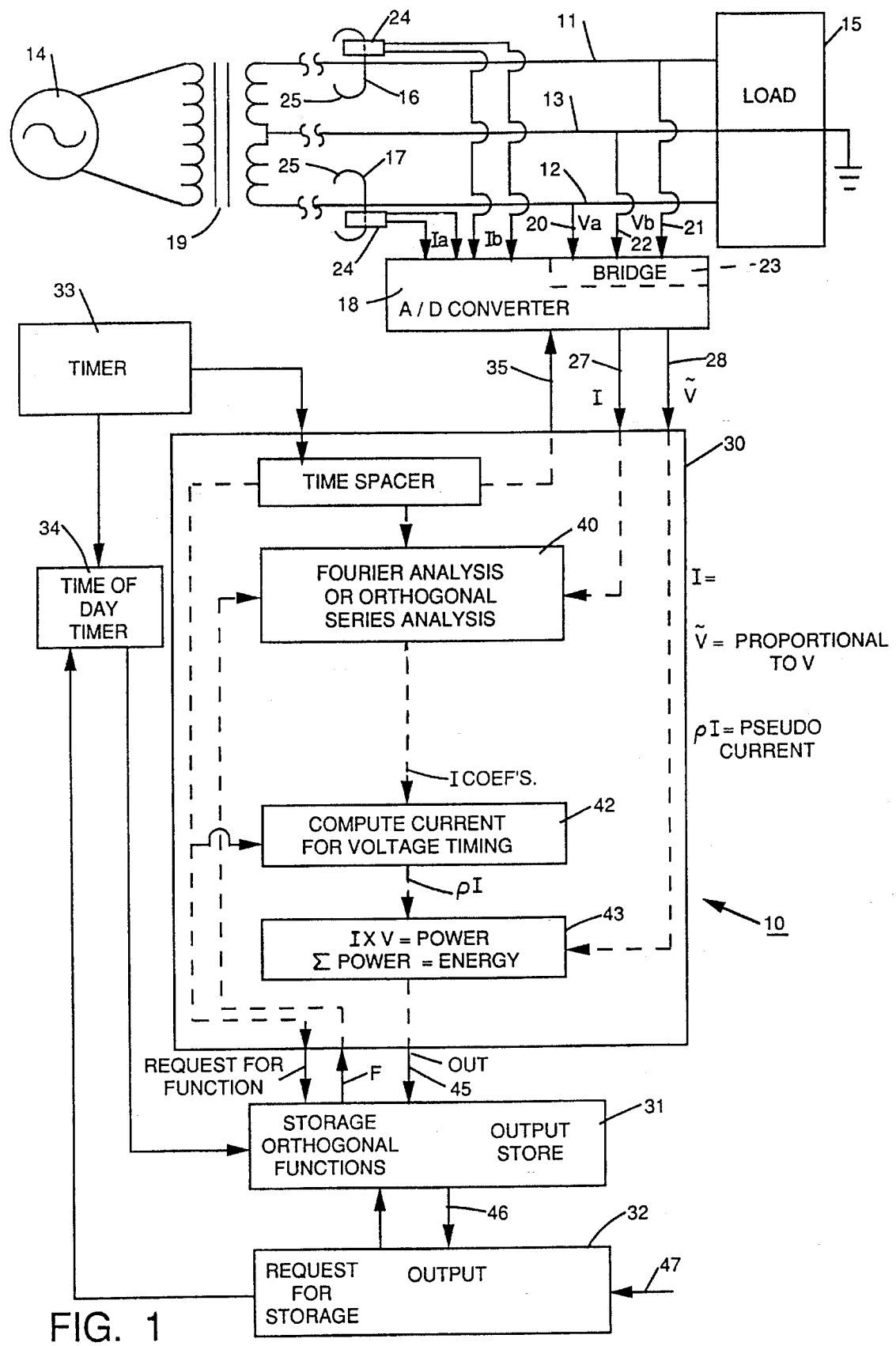
FIG. 1 is a combination schematic block diagram and flow diagram illustrating one embodiment of the teachings of the method and apparatus of the present invention.

Referring to the drawing, the electrical energy consumption meter of the present invention is generally indicated at 10 and measures electrical energy consumption from a plurality of transmission line conductors 11, 12 and 13 carrying an alternating current supplied from an alternating current source 14 through a transformer 19. In this particular illustrated embodiment of the present invention, transformer 19 acts as a three wire single phase source positioned at a remote location. It should particularly be noted that the output of a transformer has no dc voltage component. Of course, the method and apparatus of the present invention will work equally well with a two wire, single phase or any multiple phase current source.

The transmission line consisting of conductors 11, 12 and 13 is indicated as being connected to an electrical load 15, which may be any conventional load having resistive, inductive, and capacitive characteristics and which may also include nonlinear elements such as semi-conductor controlled loads. Middle conductor 13 is indicated as being the ground return for this single phase three wire system.

The energy consumption for digital watt-hour meter 10 of the present invention will be described with reference to the figure starting with the transmission line sensors. Two current pickups 16 and 17 are provided for measuring the electrical current flowing in transmission line conductors 11 and 12 respectively. These pickups, along with any needed analog preamplifiers, accordingly provide a reading proportional to the current flow to analog digital converter 18 and these respective currents are indicated as Ia and Ib.

The current pickups 16 and 17 each consist of a secondary winding (if a current transformer is used) or an integrated series with represented output of a current derivative sensor or a Hall Effect pickup (if that is used), as indicated at 24, having a core 25, which respectively pass around conductors 11 and 12. Thus determination of current flow in the power transmission lines may be done utilizing a time derivative of current detector (mutual inductance pickup) or a direct reading (current transformer).

Means for measuring voltage from the transmission line conductors is also provided in the form of voltage tap lines 20, 21 and 22 in combination with conventional resistor bridge 23, which in this instance is shown as part of the multiplexed analog digital converter 18. This conventional voltage measuring means measures voltages of Va and Vb of conductors 12 and 11 respectively with reference to ground conductor 13.

The analog value of voltage and the analog measurement of current or current derivative are both converted to digital readings in a conventional manner by the analog to digital converter thereby providing outputs 27 and 28 of the current, indicated as I, and a voltage output V which are respectively proportionate to the current and to the voltage on the transmission line. The proportionality constants must be known and must be very stable.

Timing for the analog to digital converter is provided by microprocessor 30 at terminal 35. The digital watt-hour meter 10 utilizes a computer or computer means for calculating and providing output measurements and this computer may be said to generally consist of analog to digital converter 18, microprocessor 30, register 31, input/output terminal 32, timer 33 and time of day timer 34.

Microprocessor 30 is a custom chip, but a conventional microprocessor chip which is programmed for first representing the current I with an algorithmic series for expressing cyclic phenomena may be used. In this instance, a low order Fourier Series is selected for this purpose. This function of microprocessor 30 is indicated at stage 40 in the flow chart portion of the drawing.

Then the micro processor 30 is further programmed such that in stage 42 of the flow chart an estimated recent past value of this approximated current is computed or calculated in the Fourier Series for a selected future or recent past voltage reading time. In other words, if this computed current is to be used to represent instantaneous current for a voltage reading already taken, then it will be computed for the time at which that voltage reading was previously taken. If it is to represent a future current reading for a voltage reading to be taken at a selected future time, then the current is computed for that future voltage reading time. This computed and approximated current for a selected or given future or past time is generally referred to as a pseudo current indicated as pI, as it is not the true instantaneous current.

Then the microprocessor 30 is further programmed such that in stage 43 of the flow diagram the voltage measured at the selected time or times is multiplied by the corresponding future or recent past pseudo current or currents and the result is summed, thereby obtaining an output at terminal 45 which is proportional to the kilowatt hours consumed by load 15 on the transmission line. This value is stored in memory register 31.

This kilowatt hour reading may also be transmitted as indicated at 46 to input/output terminal 32 via a conventional conductor, or by way of radio waves or telephone transmission lines or the like, if input/output terminal 32 is to be located at a remote location. Actual physical readings of the kilowatt hour consumption may be read from input/output terminal 32 as indicated at 47. This could be done by a meter reader either by use of a visual observation of meter displays or by electrical, optical, etc. coupling devices used to read the meter, or again this output could also be transmitted to a remote location for reading either visually or by another computer.

Microprocessor chip 30 may in addition be further programmed such that in stage 40 a Fourier Series is adjusted by first comparing its computed current reading with actual readings from digital output 27, to one or more values thereof already computed and fed back to stage 40 from storage in register 31 through feedback line F thereby detecting the deviation of the computed from the actual current readings, and utilizing this deviation to accordingly adjust coefficients of the Fourier Series for corrections. This comparison may also be done by summing deviations each with a weighing factor, and utilizing the sum of weighted deviations to accordingly adjust coefficients of the Fourier Series for corrections.

Alternatively to the option of the above paragraph, microprocessor chip 30 may be further programmed such that in stage 40 a Fourier Series is constructed to best fit the readings frown digital output 27. This is like the above paragraph except that no comparison is made and is in fact the necessary start-up condition for the situation in the above paragraph. The construction is accomplished by weighing each measurement individually for each coefficient. The weighing factor in the case of the Fourier Series construction includes the corresponding sine or cosine function.

Microprocessor 30 may alternatively be further programmed such that a group of readings of the time derivative of the magnetic field is taken at stage 40, as opposed to just one reading, and when this group of readings is compared to values already computed, the coefficients are adjusted to get a better fit or the group of readings is used directly to obtain new coefficients of the Fourier Series from scratch as in the above paragraph for a single reading or as would be the case here in conditions of start-up. The preferred situation, as fewer computations are needed, is the direct computation of coefficients without comparison as is done when the meter is in a start-up condition. This greatly, and perhaps even critically, reduces computation time.

Analytical filtering is accomplished in microprocessor 30 by programming the microprocessor whereby the electrical current is measured at multiple times and then the current measurement is analytically filtered automatically by expressing the current with Fourier Series using only selected harmonics thus eliminating those harmonics which define noise. Thus noise is defined as anything not expressed in terms of the selected harmonics.

This provides novel analytic filtering of noise, not to be confused with typical initial analog filtering of the detected current signal.

The microprocessor 30 is also preferably programmed to measure the voltage between conductors of the transmission line and ground at multiple times. A measurement of power of being delivered to the transmission lines is then computed by converting the filtered current or currents as expressed in Fourier Series and the voltage measurement mathematically to one or more power readings. The voltage measurement may also be analytically filtered by expressing the voltage with Fourier Series using only selected harmonics thereof for eliminating those harmonics which define noise.

With the characteristics of the microprocessor 30 as so programmed, the meter can also readily measure the phase difference between the fundamental and selected harmonics of the filtered current and those of the voltage. It is capable of measuring any current-voltage phase relationship power parameters, such as power factor and reactive power through the Fourier expansion techniques utilized.

The computer process may also be further simplified by eliminating even harmonic and/or high frequency harmonics, and possibly all harmonics where the index is an integral multiple of 3, the number of phases in the power companies' generators, in the Fourier Series.

By way of illustration, two means of feedback correction are illustrated hereinafter, the first one in the form of a description of a program and the second in the form of a typical computer program which might be utilized in microprocessor 30. The first equations illustrate one possible way of making these adjustments and the variables have the following meaning:

| | |
|---|---|
| J(t) | The current as measured by a pickup at time t. |
| scdcomp | The sum of components of the Fourier series which is to represent this current. |
| t | Time in units of electrical radians, about 2.65 milliseconds. |
| n | index of harmonic. |
| as[n] | The coefficient of the nth sine term in the current series. |
| ac[n] | The coefficient of the nth cosine term in the current series. |
| del | Deviation between measurement and computation of current pick-up. |
| Jc | Computed current (proportional factor missing). |
| m | Highest component in series considered. | delas[ ] and delac[ ] are incremental amounts to be used in correction of as[ ] and ac[ ] respectively.
And mm is a damping factor to prevent corrections from being too large.

$$scdcomp = \sum_{n=1}^{n=m} [as[n]\sin(nt) + ac[n]\cos(nt)]$$

$$del = dJ(t) - scdcomp$$

Positive del indicates that the computed value was too small. At the start of each group (or individual reading) the delas[] and delac[] terms are set to zero. Adjustments are initiated after each reading.

$$delas[n] = del*\sin(nt) \text{ (accumulated sum)}$$

$delac[n]=del*ws(nt)$ (accumulated sum)

Or, in case of a group of readings the equations are different and are:

$delas[n]=delas[n]=del*\sin(nt)$ $delac[n]=delas[n]=del*\cos(nt)$

The sine and cosine factors insure that terms contributing to the total curren are adjusted proportional to their contribution and that the sign of the correction is proper.

At completion of each reading or group of readings, the adjustments to the coefficients are made.

$as[n]=as[n]+delas[n]*mm$ (accumulated sum)

$ac[n]=ac[n]+delac[n]+mm$ (accumulated sum)

$$Jc = \sum_{n=1}^{n=m} [as[n](\sin(nt)) + ac[n]\cos(nt)]$$

This current value can be obtained for any time, t, in the cycle, not just when readings are taken. They should be computed for the instants of taking the voltage readings so that instantaneous power can be determined. The instantaneous power is V×Jc where V is the voltage measured at time t.

The sine for values for a ¼ cycle could be in a look up table. This would do for all sines and cosines of the fundamental and all harmonics.

The second method, involving one or a group of readings, is illustrated below as a segment of a BASIC program. The description (slashed lines) refer to the numbered line in the program or to the lines immediately above.

| | |
|---|---|
| 1 | w=pi/256 |
| /// | In 1, pi is the usual 3.14159265. |
| 2 | ml=32 |
| /// | In 2, ml is the number of readings in one group - before |
| /// | corrections are made. It might be as small as 1 in which case |
| /// | the means of spacing readings shown is inappropriate. |
| /// | In 3 & 4, t is the time measured in units of ¹⁄₅₁₂ of an electrical |
| /// | cycle. |
| 3 | t=t+33 |
| /// | This indicates t+33 replaces t, or t is incremented by 33 after each |
| /// | group of cycles, (³³⁄₅₁₂ cycles). |
| 4 | nb=t mod 512 |
| /// | nb is measured from the 'beginning' of each cycle. |
| /// | It is important to note that the cycle is in phase with the |
| /// | actual elecrical cycles BY CHANCE ONLY. Such alignment has no |
| /// | role in the instrument operation. |
| 5 | for m=1 to ml |
| /// | Start of a group readings of the current pickup. |
| 6 | if m mod 2=0 then |
| /// | (if m is even) |
| 7 | delt=401 |
| /// | (take the next reading ⁴⁰¹⁄₅₁₂ cycle later) |
| 8 | else |
| /// | (otherwise) |
| 9 | delt=53 |
| /// | (take the next reading ⁵³⁄₅₁₂ cycles later) |
| 10 | end if |
| 11 | t=t+delt |
| /// | Lines 7 through 12 show that readings don't have to be evenly spaced. |
| 12 | nb=t mod 512 |
| /// | (only the phase of nb is important) |
| 13 | Jc=0 |
| /// | Jc is the symbol for computed (Fourier Series) current. |
| 14 | for n=1 to 11 step 2 |
| /// | The 'step 2' above indicates that even harmonics are ignored here. |
| /// | Leaving out 'step 2' is arbitrary. If left out, even harmonics are |
| /// | computed. |
| 15 | Jc=Jc+ass(n)*sin(n*w*nb)+acc(n)*w*nb) |
| /// | (adding harmonic components) |
| 16 | next n |
| /// | If computations are to obtain new coefficients with |
| /// | adjustments, lines 13 through 16 are left out and Jc=0. |
| 17 | del=J(t)–Jc |
| /// | del is the deviation between measured (J(t)) and computed current. |
| /// | In lines 18–21 dass ( ) and dacc ( ) are correction terms |
| /// | computed after each reading. |
| 18 | for n=1 to 11 step 2 |
| 19 | dass(n)=dass(n)+del*sin(n*w*nb) |
| 20 | dacc(n)=dacc(n)+del*cos(n*w*nb) |
| 21 | next n |
| 22 | next m |
| /// | End of a group readings |
| 23 | for n=1 to 11 step 2 |
| 24 | ass(n)=ass(n)+2*dass(n)/ml |
| 25 | acc(n)=acc(n)+2*dacc(n)/ml |
| /// | dass and dacc reset to zero for next group. |
| 26 | dass(n)=0 |
| 27 | dacc(n)=0 |
| 28 | next n |

| | |
|---|---|
| /// | New assignments of ass( ) and acc( ) after each group. |
| 29 | del=0 |
| 30 | Jc=0 |
| /// | Resets for del and Jc for next cycle. |
| 31 | goto 3 |
| /// | Recycling |

As previously noted, it is desirable for a number of reasons that the timing of the pseudo current and voltage measurements be independent of the actual power system frequency. If the timing is generated electronically, the cycle lengths of the fundamental and all harmonics would not exactly coincide with the actual lengths in the power system. This will cause a slight but continuously increasing phase shift as time progresses. The actual time of day registered in the time of day timer 34 can be reset at appropriate times such as once a month or so when the meters are read for billing purposes either at location or remotely.

In this aforedescribed computation, procedure, the current pickup, as expressed with an algorithmic series for expressing, cyclic phenomena, is approximated in value for a selected future or recent past voltage reading time, and then it is multiplied by that measurement of voltage or voltages, prior to the step of summing this power reading to obtain a number value proportional to the energy consumed through the conductors.

However, when following the teachings of the present invention, there are multiple ways in which the energy consumption can be computed, once the current pickup has been expressed as an algorithmic series for expressing cyclic phenomena or in the low order Fourier series, for example. For example, the current and voltage not only do not have to be measured simultaneously but as an additional example, one does not have to be computed for the time of occurance of the measurement of the other as was previously expressed in the example of FIG. 1. One alternative example of computation is illustrated in FIG. 2.

In general, energy delivered can be expressed mathematically as the integral of instantaneous current times the simultaneously taken instantaneous voltage. When each of these are expressed as Fourier series, it is seen that all cross terms (between sines and cosines and between frequencies) in the product drop out. Furthermore, the voltage wave form as delivered by the power company transformer remains much more nearly sinusoidal, not being distorted by the various loads on the system nearly as much as the current wave form.

Thus the voltage wave form contains only small harmonic content and no direct current component. The even harmonics of power are no doubt low as they are the result of imbalance between the two halves of both the voltage and current wave. The required precision therefore does not necessarily require inclusion of even harmonics in the current wave form, and the analysis is clearly somewhat simplified if they are left out. Also, almost no power systems deliver third harmonic power or any harmonic of the third harmonic (3, 6, 9, etc.). These also may be left out of the instruments for those systems.

Because of these considerations, no attempt need be made to duplicate the high frequency found in the current in many applications. Because the high frequency component of the voltage is very much smaller, no high frequency need be computed for the current wave form. That is, the algorithmic or Fourier series describing the current pickup need have no high harmonic content in spite of its possible high harmonic content.

When the analytic expression for both current and voltage are obtained, the coefficients of sines and separately the coefficients of cosines for each harmonic in the current and voltage expressions are multiplied, then their sum is divided by two. In the example shown, readings of the current are made so that time gaps are produced during which voltage readings and readings on a second line, as well as various calculations of current and power can be performed.

The current may be expressed as $$I = a1*\sin(wt) + a3*\sin(3wt) + a5*\sin(5wt) + + +$$
$$+b1*\cos(wt) + b3*\cos(3wt) + b5*\cos(5wt) + + +$$

The voltage as $$V = A1*\sin(wt) + A3*\sin(3wt) + A5*\sin(5wt) + + +$$
$$+B1*\cos(wt) + B3*\cos(3wt) + B5*\cos(5wt) + + +$$

The Fourier coefficients for the voltage are obtained in real time by a series of adjustments using one of the techniques of the disclosure for current in FIG. 1. For the current the technique is the same as that used in the disclosure for FIG. 1.

The power is then $$\text{Power}=[a1*A1+b1*B1+a3*A3+b3*B3+a5*A5+b5*B5+++]/2$$

Note in particular that no current per se is computed and note that the average cyclic power per se is determined.

Referring specifically to FIG. 2, this latter method of computation is illustrated. Like elements are designated with the same reference numerals. Only the modified portion of the apparatus illustrated in FIG. 1 is shown. This was done for simplification as it is not necessary to reproduce the entire circuit of FIG. 1 for the purpose of illustration.

In this alternative design, the microprocessor 30 is programmed to make the computation of energy consumption in a different manner, while still following the teachings of the present invention. Instead of merely making a Fourier analysis of the current I, Fourier analysis is conducted not only on the current, but also on the voltage pickup, as indicated at stage 50 in the flow chart portion of FIG. 2 and as discussed in the case above. Thus, the voltage measurement, as well as, the current pickup is represented in an algorithmic series for expressing cyclic phenomena.

Then as shown in stage 51, the microprocessor is programmed to separately multiply the voltage coefficients of sines by the current coefficient of sines and the coefficients of cosines by the coefficient of current coefficients of cosines of each harmonic in the current and the voltage algorithmic series for Fourier expression. Each harmonic product is divided by twice the harmonic index which accordingly gives an expression of power. Thereafter, as illustrated in the last stage 52, these multiplication results are then summed to provide an output measurement proportional to the value of the energy consumed through the original conductors. Thereafter, the error correction and the averaging of functions may be carried out in the same manner as was done in regard to the illustrations of FIG. 1.

The digital power meter of the present invention involves Fourier expansion and permits a simple means of filtering without loss of information or accuracy or the introduction of any power factor error. Such filtering is advantageous as it can remove noise that could otherwise interfere with proper metering function. Acceptable methods of filtering are described hereinafter.

The filter may be an analog filter consisting only of elements such as capacitors, inductors or resistors, which are used in the current pickup circuit. A filter with identical frequency dependence of attenuation and phase shift would also be used on the voltage pickup. As a result, the harmonics of both signals are identically phase shifted and attenuated. When the harmonic coefficients are multiplied, only the attenuation will be involved in determining the power magnitude as no change of power factor will result for the fundamental or for any of its harmonics.

With a known filter arrangement, the attenuation for each harmonic will be known. Let the h harmonic attenuation =Ah. Then the contribution of the h harmonic to power will be effectively attenuated by the multiplier $(Ah)^2$.

When power is determined by multiplying the harmonic amplitudes, the product of the h harmonic is divided by this effective attenution, the square of the individual attenuations. This restores its proper magnitude.

Additionally, diode clippers may also be employed in a conventional manner to cancel noise at the pickup outputs.

The filter for the voltage and current must have identical phase shifting characteristics. That is, the phase shift for the fundamental must be the same for both filters as must the various phase shifts for each of the relevant harmonics individually. This implies that the attenuation of both the current derivative and votage will be equal, harmonic by harmonic. This does not imply that the hardware structure of the filters must be identical.

The simplest filter that will remove high frequencies moderately well is the simple R-C filter consisting of a resistor structure and a capacitor. The resistor structure may be a resistor network or a simple resistor. Two filters are identical for this purpose if they have the same RC product, where R is the effective resistance of the network.

The attenuation, A, of an R-C filter is given in terms of T, the RC product which has the dimensions of time and is the R-C filter time constant:

$$A=1/sqrt[1+(wT)^2$$

Where w is the angular frequency, or 2×pi×ff×n, where pi=3.14159, ff is the fundamental frequency, 60 (Hz) for example, and n is the harmonic. Thus the voltage filter and the current derivative filter must have the same time constants. As a result, the indicated power associated with each harmonic will be diminished by the square of this attenuation.

As an example, the embodiment of FIG. 2 illustrates the addition of filter 52' at the voltage pickup output and filter 52' at the current pickup. These filters are illustrated in detail in FIG. 3. The voltage filter consists of a simple R-C construction consisting of two resistors in series with a capacitor across one of them. As seen, the resistors are designated as R1 (the high voltage contact resistor) and R2 (the resistor associated with the common line 13) and the capacitor is designated as C1. The effective resistance of the two resistors in the filter is their product divided by their sum. Thus the effective filter resistance R, is given by R=R1*R2/[R1+R2].

The simple series voltage divider involved produces a dc output voltage equal to the input voltage times R2/[R1+R2]. Attenuation in this context refers to reduction of this output value by the addition of the capacitor. The output of this filter is taken at the junction of R1, R2 and capacitor C1.

The current signal might best be filtered between two stages of amplification. The filter could be a simple RC filter using one resistor, Ri, in series with a capacitor C2 as shown in FIG. 4. The output of this stage of the filter (and input to the next stage of amplification) is the junction of the resistor and the capacitor.

The filtered voltage and current derivative signals are treated as discussed in the earlier disclosures. The output for each frequency is compensated for its attenuation by multiplying it by $$M=1+(wT)^2, \text{ the inverse of } A^2.$$

In case the voltage isn't put into Fourier series form, the current is computed using this multiplier for each harmonic. (Note that its value is harmonic dependent.) If the harmonic amplitudes of the voltage and current are multiplied together, each harmonic product is multiplied by its corresponding factor before proceeding.

As an example, for T=0.53052 ms for a 60 Hz system, the values of wT for the fundamental and the 3, 5, 7, 9, 11 harmonics are:

| Harmonic | Frequency | wT | M(ultiplier) |
| --- | --- | --- | --- |
| 1 | 60 Hz | .2 | 1.04 |
| 3 | 180 | .6 | 1.36 |
| 5 | 300 | 1.0 | 2.0 |
| 7 | 420 | 1.4 | 2.96 |
| 9 | 540 | 1.8 | 4.24 |
| 11 | 660 | 2.2 | 5.84 |

The principals and techniques discussed above can readily be used to construct an all digital simulation of a nonsaturating current transformer suitable for control purposes. Both odd and even harmonics should be used. The number of harmonics is somewhat arbitrary, but conventional current transformers indicate nothing but low harmonics.

I claim:

1. The method of measuring electrical power delivery from a plurality of transmission line conductors carrying alternating current, comprising the steps of, measuring the electrical current flowing in a transmission line conductor at multiple times independent of voltage phase, expressing said current measurement with Fourier Series using only selected harmonics thereof and thus eliminating those harmonics which define noise and thereby analytically filtering the current measurement, measuring the voltage between conductors of the transmission line and ground at multiple times, and computing power being delivered through the transmission lines by coverting the filtered current measurement expressed in Fourier Series and the voltage measurement mathematically to power readings.

2. The method of claim 1 wherein the step of measuring the voltage includes the step of analytically filtering the voltage measurement by expressing said voltage with Fourier Series using only its fundamental and selected harmonics thereof thus eliminating those harmonics which define noise, and the step of computing power is carried out by converting the filtered current as expressed in Fourier Series and the filtered voltage as expressed in Fourier Series to a filtered power measurement.

3. The method of claim 2 including step of summing the power reading to obtain a number value proportional to the energy consumed through said conductors, and wherein the step of computing an approximation of the power includes the steps of expressing said voltage measurement in Fourier Series, separately multiplying coefficients of sines and coefficients of cosines for each harmonic in the current and voltage Fourier Series expressions.

4. The method of claim 3 wherein said Fourier Series are low order Fourier Series.

5. The method of claim 3 including a step of filtering noise from the current measurement and from the voltage measurement to give identical phase shifts prior to the step of computing, and, after the step of computing, multiplying each harmonic coefficient by an appropriate factor to correct for both the attenuation of the current measurement and the attenuation of the corresponding voltage measurement.

6. The method of claim 3 including a step of filtering noise from the current measurement and the voltage measurement with filters to give identical phase shifts and attenuation prior to the step of computing, and after the step of computing, multiplying the voltage output harmonics and the current output harmonics by an attenuation factor required to compensate for known attenuation to which each has been subjected as a result of said filtering.

7. The method of claim 6 wherein the step of multiplying each harmonic by said attenuation factor comprises multiplication thereof by a reciprocal of said attenuation factor, thereby dividing each harmonic by the attenuation factor.

8. The method of claim 3 wherein the voltage measurement is expressed in terms of only the fundamental of its Fourier Series and the filtered current series is then phase shifted relative to the Fourier Series fundamental voltage measurement thereby expressing the current relative to the zero voltage crossings.

9. The method of claim 1 wherein the current measurement is accomplished through the use of a current derivative pickup, which provides the derivative of the current measurement, and thereafter utilizing integrated Fourier Series for expressing the current measurement.

10. The method of claim 1 wherein the current measurement is accomplished through the use of a current transformer.

11. The method of claim 10 wherein the step of measuring the current includes the step of correcting all components of the current as expressed in Fourier Series to compensate for the known frequency attenuation characteristics of the current transformer.

12. The method of claim 1 including a step of measuring the phase difference between the fundamental and selected harmonics waveforms of the filtered current and those of the voltage.

13. The method of claim 1 including a step of measuring current-voltage phase relationship power parameters such as power factor and reactive power.

14. The method of claim 1 including a step of converting the measurement of the current to digital value prior to the step of analytically filtering.

15. The method of claim 1 wherein the step of computing power includes the steps of, computing an estimated one of future and recent past values of said filtered current in said Fourier Series for a selected one of future and recent past voltage reading time or times, measuring said voltage at said selected one of future and recent past times, and multiplying said measurements of voltage and current.

16. The method of claim 15 wherein the step of filtering current measurement flowing in the conductor by representing it with Fourier Series includes the step of eliminating even harmonics in the Fourier series representing a current wave form.

17. The method of claim 16 wherein the step of filtering current measurement includes the step of eliminating high frequency harmonics in the Fourier series representing the current wave form.

18. The method of claim 1 including a step of comparing a Fourier Series reading of the filtered current in said conductor, when taken, to a value thereof already computed and thereby detecting the deviation of the computed from actual filtered current readings, and utilizing said deviation to accordingly adjust coefficients of the Fourier Series for corrections.

19. The method of claim 18 wherein the step of comparing is characterized in that a group of said readings of the filtered current and said value or values already computed are assumed to be zero for the purposes of said comparison such that said group of readings is used directly to obtain new coefficients of the Fourier Series.

20. The method of claim 18 wherein said Fourier Series is a low order Fourier Series.

21. The method of claim 1 including the step of comparing a Fourier Series reading of the current in said conductor, when taken, to the value thereof already computed, summing deviations each with a weighing factor, and utilizing a sum of weighted deviations to accordingly adjust coefficients of the Fourier Series for corrections.

22. The method of claim 21 wherein the step of comparing is characterized in that a group of said readings of the current and said values already computed are assumed to be zero for the purposes of said comparison such that said group of readings is used directly to obtain new coefficients of the Fourier Series.

23. The method of claim 1 wherein the step of computing power includes the step of eliminating even harmonics in the Fourier Series expression of the current measurement.

24. The method of claim 1 wherein the step of computing power includes the step of eliminating high harmonic content in the Fourier Series expression of the current measurement.

25. The method of claim 1 including a step of filtering noise from the current measurement and the voltage measurement to give identical phase shifts prior to the step of computing, and after the step of computing, dividing each Fourier harmonic coefficient by the square of a corresponding voltage measurement, which has not been put in harmonic form.

26. A digital meter for measuring electrical power delivery from a plurality of transmission line conductors carrying alternating current comprising; current pickup means for measuring an electrical current flowing in a transmission line conductor thereby obtaining a reading proportional to the current flow and independent of the voltage phase and voltage pickup means adapted to measure the voltage between conductors of the transmission line and ground; computer means connected to said current pickup means and to said voltage pickup means and programmed for measuring the electrical current with said current pickup at multiple times and for analytically filtering the current measurement by expressing said current with Fourier Series using only selected harmonics thereof and thus eliminating those harmonics which define noise, and for measuring the voltage with said voltage pickup at multiple times which are independent of the voltage phase and for computing power being delivered through the transmission lines by converting the filtered current measurements as expressed in Fourier Series and the voltage measurements mathematically to power readings.

* * * * *